United States Patent
Ogawa et al.

(10) Patent No.: US 8,395,102 B2
(45) Date of Patent: Mar. 12, 2013

(54) PHOTOELECTRIC CONVERSION MODULE WITH ISOLATING GROOVE AT EACH GAP BETWEEN ADJACENT METALLIC COATING LAYERS

(75) Inventors: Hachinori Ogawa, Hokkaido (JP); Atsushi Kanayama, Hokkaido (JP)

(73) Assignee: Kyosemi Corporation, Kyoto (JP)

( * ) Notice: Subject to any disclaimer, the term of this patent is extended or adjusted under 35 U.S.C. 154(b) by 324 days.

(21) Appl. No.: 12/734,780

(22) PCT Filed: Dec. 4, 2007

(86) PCT No.: PCT/JP2007/001343
§ 371 (c)(1), (2), (4) Date: May 24, 2010

(87) PCT Pub. No.: WO2009/072163
PCT Pub. Date: Jun. 11, 2009

(65) Prior Publication Data
US 2010/0230582 A1    Sep. 16, 2010

(51) Int. Cl.
*H01J 40/14* (2006.01)
*G01J 1/04* (2006.01)

(52) U.S. Cl. .............. 250/214 R; 250/227.11

(58) Field of Classification Search .......... 250/214 R, 250/214 A, 227.11, 227.14; 398/140, 141, 398/160, 202, 212, 214; 385/14, 88–94, 385/147; 367/152; 333/124, 17.3, 32–35
See application file for complete search history.

(56) References Cited

U.S. PATENT DOCUMENTS

| | | | |
|---|---|---|---|
| 6,101,295 A * | 8/2000 | Mineo et al. ............. | 385/1 |
| 6,930,300 B1 * | 8/2005 | Douma et al. ........... | 250/214 A |
| 2005/0264862 A1 | 12/2005 | Arima et al. | |

FOREIGN PATENT DOCUMENTS

| | | |
|---|---|---|
| JP | 5-20358 | 3/1993 |
| JP | 11-38372 | 2/1999 |
| JP | 2003-115630 | 4/2003 |
| JP | 2005-338678 | 12/2005 |

\* cited by examiner

*Primary Examiner* — Pascal M Bui Pho
(74) *Attorney, Agent, or Firm* — Jordan and Hamburg LLP

(57) ABSTRACT

A photoelectric conversion module includes a photoelectric conversion element that converts an arriving optical signal transmitted via an optical fiber into an electrical signal, a signal output section that outputs a photoelectrically converted electrical signal to the exterior, an impedance matching circuit provided between an output electrode of the photoelectric conversion element and the signal output section, and a substrate upon which this impedance matching circuit is mounted, with the impedance matching circuit including a plurality of metallic coating layers formed upon the surface of the substrate with gaps being left between them, and a plurality of metallic connecting lines that electrically connect together adjacent ones of these metallic coating layers.

4 Claims, 13 Drawing Sheets

US 8,395,102 B2

PHOTOELECTRIC CONVERSION MODULE WITH ISOLATING GROOVE AT EACH GAP BETWEEN ADJACENT METALLIC COATING LAYERS

TECHNICAL FIELD

The present invention relates to a photoelectric conversion module for receiving a modulated optical signal by broadband optical communication, and for converting this optical signal to an electrical signal and outputting the electrical signal.

BACKGROUND OF THE INVENTION

In the past, in optical communication, optical fiber that can transmit high capacity data at high speed over long distances has been used as a transmission medium. Photoelectric conversion modules of various types have been developed and practically implemented that convert an optical signal arriving by transmission from such an optical fiber into an electrical signal using photoelectric conversion element such as a photo-diode or the like, and that then output that electrical signal to the exterior.

Now, a typical such photoelectric conversion module will be explained. As shown in FIGS. 25 and 26, this photoelectric conversion module 101 comprises an optical lens (optical window) 106 that regulates the optical signal arriving by transmission from an optical fiber 105, a photoelectric conversion element 108 that converts the optical signal into an electrical signal, and a signal output section 121 that outputs this electrical signal to the exterior, etc. An output electrode 108a of the photoelectric conversion element 108 and a center conductor 121a of the signal output section 121 are electrically connected by a metallic wire 115, and thereby the electrical signal is outputted to the exterior of the module 101.

And, with the photoelectric conversion module 101A shown in FIGS. 27 and 28, an amplifier 130 is provided between the photoelectric conversion element 108 and signal output sections 121. This amplifier 130 is an amplifier that amplifies the single phase electrical signal that has been produced by photoelectric conversion. The output electrode 108a of the photoelectric conversion element 108 and an input electrode 130a of the amplifier 130 are electrically connected with a metallic wire 132, and output electrodes 130b of the amplifier 130 are electrically connected to the center conductors 121a of the signal output sections 121 by metallic wires 133.

With the photoelectric conversion module 101 described above and shown in FIGS. 25 and 26, the output electrode 108a of the photoelectric conversion element 108 and the center conductor 121a of the signal output section 121 are directly connected by the metallic wire 115. And, with the photoelectric conversion module 101A shown in FIGS. 27 and 28, the output electrode 108a of the photoelectric conversion element 108 and the input electrode 130a of the amplifier 130 are directly connected by the metallic wire 132, while the output electrodes 130b of the amplifier 130 and the center conductors 121a of the signal output sections 121 are directly connected by the metallic wires 133. Each of the metallic wires 132 and 133 has an inductance component, and this is a high impedance as compared with the characteristic impedances of the output electrode 108a of the photoelectric conversion element 108, of the output electrodes 130b of the amplifier 130, and of the signal output sections 121. Due to this, there has been the problem that reflection of the electrical signal takes place because of this impedance mis-matching, in particular in the high frequency band, so that the high frequency characteristic deteriorates.

Thus, with the photoelectric conversion module 102 described in Patent Document #1, as shown in FIG. 29, there is included a transmission line substrate 140 that outputs the electrical signals after conversion to the exterior of the module 102, and a substrate 120 upon which an impedance matching circuit 110 is installed is provided between the amplifier 130 and the transmission line substrate 140. This impedance matching circuit 110 comprises parallel flat plate micro chip capacitors 112 that have capacitance components, and metallic wires 114 that are electrically connected between the amplifier 130 and the capacitors 112 and between the capacitors 112 and the transmission line substrate 140, each of these metallic wires 114 having an inductance component.

An equivalent circuit for the impedance matching circuit 110 described above is shown in FIG. 30. The capacitance component 112a is adjusted by varying the dimensions of the capacitor 112 and the material of which it is made, while the inductance components 114 are adjusted by varying the lengths of the metallic wires 114. It is possible to anticipate impedance matching with respect to the transmission line substrate 140 in this manner, and so it is possible to improve the high frequency return loss characteristic of the photoelectric conversion module 102, and it is possible to improve the transmission characteristics for electrical signals.

Patent Document #1: Japanese Laid-Open Patent Publication 2002-353493.

However, since this equivalent circuit for the impedance matching circuit 110 of the photoelectric conversion module 102 of Patent Document #1 is similar to the circuit for a single stage low pass filter as shown in FIG. 30, there is an anxiety that the transmission loss in the high frequency band will increase, and that the flatness of the transmission characteristic will be damaged. Thus, while there is a need to set the capacitance component 112a and the inductance component 114a to values one level higher in order to improve the transmission characteristic, if this is done, there is an anxiety that the phase linearity will not be maintained, and that this will invite deterioration of the group delay.

Therefore, an object of the present invention is to provide a photoelectric conversion module which can reduce return losses due to impedance mismatching and also enhance the flatness of the transmission characteristic in the high frequency band, and which can stabilize the group delay characteristic by maintaining the phase linearity.

SUMMARY OF THE INVENTION

The photoelectric conversion module according to the present invention is one that comprises a photoelectric conversion element for converting an optical signal transmitted via an optical fiber into an electrical signal and a signal output section for outputting to the exterior the electrical signal after photoelectric conversion, and further comprises an impedance matching circuit that is provided between an output electrode of the photoelectric conversion element and the signal output section, and a substrate upon which the impedance matching circuit is mounted; and the impedance matching circuit comprises a plurality of metallic coating layers formed upon the surface of the substrate with gaps left between adjacent ones of these metallic coating layers, and a plurality of metallic connecting lines that electrically connect adjacent ones of these metallic coating layers.

With this photoelectric conversion module, the optical signal that has arrived by transmission via the optical fiber is conducted to the photoelectric conversion element, this optical signal is converted into an electrical signal by the photoelectric conversion element, and this electrical signal after photoelectric conversion is outputted to the exterior from the signal output section via the impedance matching circuit that is installed upon the substrate.

And the impedance matching circuit includes the plurality of metallic coating layers and the plurality of metallic connecting lines that electrically connect adjacent ones of these metallic coating layers; and, since the metallic coating layers have capacitance components and the metallic connecting lines have inductance components, accordingly, by appropriately adjusting the capacitance components of the plurality of metallic coating layers and the inductance components of the plurality of metallic connecting lines, it becomes possible to perform impedance matching with respect to the signal output section.

In addition to the constitution of the present invention as described above, it would also be acceptable to arrange to employ various other structural features as appropriate, as follows.

(1) The impedance matching circuit may comprise a metallic wire that connects the output electrode of the photoelectric conversion element, and one of metallic coating layers that is adjacent to that output electrode.
(2) An amplifier that amplifies the photoelectrically converted electrical signal may be connected to the output electrode of the photoelectric conversion element, and the impedance matching circuit may be provided between an output electrode of the amplifier and the signal output section.
(3) The impedance matching circuit may include a metallic wire that connects the output electrode of the amplifier and one of metallic coating layers that is adjacent to that output electrode.
(4) An isolating groove may be formed upon the surface of the substrate at each gap between adjacent ones of metallic coating layers.
(5) A dielectric that has lower dielectric constant (relative permittivity) than the base material of which the substrate is formed may be charged into the isolating groove.
(6) The metallic connecting lines may be metallic wires.
(7) The metallic connecting lines may be linear metallic coating layers that are integral with metallic coating layers.
(8) The photoelectric conversion module according to claim 9 is one that comprises a photoelectric conversion element for converting an optical signal transmitted via an optical fiber into an electrical signal and a signal output section for outputting to the exterior the electrical signal after photoelectric conversion, and further comprises an impedance matching circuit that is provided between an output electrode of the photoelectric conversion element and the signal output section, and a substrate upon which the impedance matching circuit is mounted; and the impedance matching circuit comprises a metallic coating layer in micro strip form, formed upon a surface of the substrate, and directly connected to the signal output section.

According to the invention, since the plurality of metallic coating layers of the impedance matching circuit have capacitance components, and the plurality of metallic connecting lines that connect adjacent ones of the metallic connecting layers together have inductance components, it is possible to perform impedance matching with respect to the signal output section in a reliable manner by appropriately adjusting the dimensions and the thicknesses of these metallic coating layers and the material of which the substrate is made, and by appropriately adjusting the thicknesses and the lengths of the plurality of metallic connecting lines. By doing this, it is possible to suppress the transmission loss of a high frequency electrical signal, and to improve the return loss characteristic.

In particular since, due to the plurality of metallic coating layers and the plurality of metallic connecting lines, the structure of the impedance matching circuit is similar to that of a multi-stage low pass filter, accordingly it is possible to improve the transmission loss in the high frequency band as compared to the case of a single stage impedance matching circuit, and it is possible to enhance the flatness of the transmission characteristic. Moreover, it becomes possible to keep the values of both the capacitance component and the inductance component low, it is easy to maintain the phase linearity of the electrical signal and to stabilize the group delay characteristic, and it is also possible to keep down distortion of the waveform of the electrical signal during transmission to the minimum possible level.

According to the invention, it is possible to adjust the value of the inductance component by appropriately adjusting the length and/or the thickness of the metallic wire.

According to the invention, along with the single phase electrical signal that has been converted by the photoelectric conversion element being amplified by the amplifier, also it is possible to convert this single phase signal to an operating signal and to output that operating signal to the exterior.

According to the invention, it is possible to adjust the inductance component by appropriately adjusting the length and/or the thickness of the metallic wire.

According to the invention, since the isolating groove is formed in the surface of the substrate at each gap between adjacent ones of the plurality of metallic coating layers, accordingly it is possible to maintain the mutual isolating between these adjacent metallic coating layers.

According to the invention, since the dielectric whose dielectric constant is lower than that of the base material of which the substrate is formed is charged, accordingly it is possible to strengthen the mutual isolation between the adjacent metallic coating layers.

According to the invention, since the metallic connecting line consists of a metallic wire, accordingly it is possible to adjust the value of the inductance component of the metallic wire by appropriately adjusting the length and/or the thickness of the metallic wire.

According to the invention, since the metallic coating lines are made as linear metallic coating layers that are integral with metallic coating layers, it is possible to adjust the inductance components of these linear metallic coating layers by appropriately adjusting the lengths and/or widths and thicknesses and so on of the linear metallic coating layers, so that it is possible reliably to perform impedance matching; and, furthermore, since it is possible to form the linear metallic coating layers upon the substrate in one process at the same time as forming the metallic coating layers which are shaped as wider in width, accordingly it is possible to shorten the time for manufacture.

According to the invention, since the substrate upon which the impedance matching circuit is mounted is provided, and this impedance matching circuit has the metallic coating layer in micro strip form that is formed upon the surface of the substrate and moreover is directly connected to the signal output section, accordingly the following advantageous effects are obtained.

Since, by forming the metallic coating layer in micro strip form, it is possible simply and easily approximately to calculate its characteristic impedance, and moreover since, by directly connecting this metallic coating layer to the signal output section, it is possible to reduce the inductance component of the connection portion, accordingly it is possible to perform impedance matching to the signal output section in a reliable manner. By doing this, it is possible to suppress the transmission loss of high frequency electrical signals, and to improve the return loss characteristic.

With this micro strip form structure, since it is possible to stabilize the capacitance component and the inductance component of the metallic coating layer, accordingly it is possible to enhance the flatness of the transmission characteristic in the high frequency band, and the linearity of the phase can be easily maintained, so that it is possible to stabilize the group delay characteristic. Due to this, it is possible to suppress distortion of the waveform of the electrical signal during transmission to the maximum possible extent.

Further, since it is arranged to output the signal from the output electrode of the photoelectric conversion element to the exterior via the impedance matching circuit, and, as compared to the prior art, it is possible to reduce the number of components making up the transmission path such as a transmission line substrate and so on, accordingly not only it is possible to suppress variation of the characteristics, but also it is possible to decrease the number of components, and thereby to simplify the construction and also to reduce the manufacturing cost.

According to the invention, since the impedance matching circuit includes the metallic wire that connects the output electrode of the photoelectric conversion element and the metallic coating layer, accordingly it is possible to adjust the value of the inductance component by appropriately adjusting the length and/or the thickness of the metallic wire.

According to the invention, since the amplifier that amplifies the electrical signal that has been photoelectrically converted being connected to the output electrode of the photoelectric conversion element, and the impedance matching circuit is provided between the output electrode of the amplifier and the signal output section, accordingly, along with the single phase electrical signal that has been converted by the photoelectric conversion element being amplified by the amplifier, also it is possible to convert this single phase signal to an operating signal and to output that operating signal to the exterior.

According to the invention, since the impedance matching circuit includes the metallic wire that connects the output electrode of the amplifier and the metallic coating layer, accordingly it is possible to adjust the value of the inductance component by appropriately adjusting the length and/or the thickness of the metallic wire.

Figure 1:
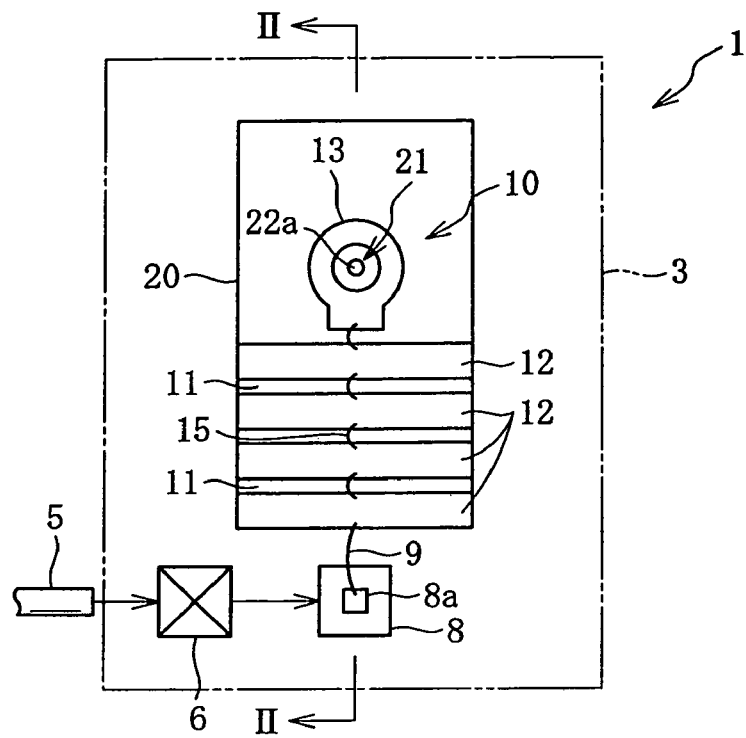
FIG. 1 is a plan view of a photoelectric conversion module according to a first embodiment of the present invention.

DESCRIPTION OF NUMERALS 1, 1A, 1B, 1C, 1D, 1E photoelectric conversion modules
5 optical fiber
8 photoelectric conversion element
8a output electrode
10, 10B, 10C, 10D, 10E impedance matching circuits
12 metallic coating layer
13 metallic coating layer
15 metallic wire
20, 20B, 20C, 20D, 20E substrates
21, 21B, 21C, 21D, 21E signal output sections
22 lead line

DESCRIPTION OF THE PREFERRED EMBODIMENTS

The photoelectric conversion module of the present invention is a module that receives an optical signal that has arrived by transmission via an optical fiber by broadband optical communication, converts it into an electrical signal, and outputs that electrical signal to the exterior; and in particular is a module that includes an impedance matching circuit having a similar construction to a multi-stage low pass filter.

Embodiment 1

In the following, this photoelectric conversion module 1 will be explained with reference to the drawings.

Figure 2:
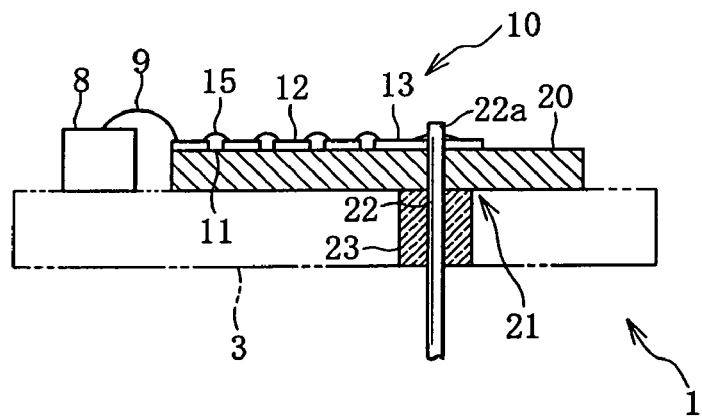
FIG. 2 is a sectional view taken along II-II line of FIG. 1.

As shown in FIGS. 1 and 2, this photoelectric conversion module 1 is a module which converts an optical signal that has arrived by broadband transmission via an optical fiber 5 into an electrical signal and outputs that electrical signal. This photoelectric conversion module 1 comprises a package 3, an optical lens 6 (i.e., an optical window), a photoelectric conversion element 8 that performs photoelectric conversion upon an optical signal, an impedance matching circuit 10 that is provided between an output electrode 8a of the photoelectric conversion element 8 and a signal output circuit 21, a substrate 20 upon which the impedance matching circuit 10 is installed, and the signal output circuit 21 that outputs the signal converted by the photoelectric conversion to the exterior, etc.

The photoelectric conversion element 8 is a typical photodiode element, and is fixed in the package 3. This photoelectric conversion element 8 receives an optical signal that has arrived by transmission via the optical fiber 5 through the optical lens 6 upon its light reception surface, performs photoelectric conversion thereupon, and outputs the resulting electrical signal from the output electrode 8a.

The output electrode 8a of this photoelectric conversion element 8 is electrically connected to a metallic coating layers 12 that are proximate to this output electrode 8a on the input side of the impedance matching circuit 10 and a metallic wire 9.

The impedance matching circuit 10 includes a plurality of metallic coating layers 12, 13 that are formed upon the upper surface of the substrate 20, a plurality of metallic wires 15 (these are equivalent to metallic connecting lines) that electrically connect together adjacent ones of these metallic coating layers 12, and the metallic wire 9.

The metallic coating layers 12, 13 are coating layers made from a metal selected from, for example, Ni, Au, Ag, Al, Cu or the like, and their thickness may be, for example, 5 to 100 μm. Each of the metallic coating layers 12 is made as a long narrow rectangle extending in the left-right direction in the drawing (for example, its length in the left-right direction may be 1.20 mm and its width 0.15 mm), and moreover this plurality of metallic coating layers 12 are formed as extending parallel with suitable gaps 11 being left between them, of width around 0.05 mm for example. And the metallic coating layer 13 is formed in the shape of a circle with its lower end portion projecting towards the metallic coating layers 12, and is provided upon the extension of the line connecting the center portions in the widthwise direction of the plurality of metallic coating layers 12.

The signal output section 21 comprises a lead line (center conductor) 22 and a dielectric 23 made from melted glass that shields the external surface of the lead line 22. This lead line 22 is fixed to the package 3 by the dielectric 23, and the tip end portion 22a of the lead line 22 passes through the substrate 20 and the center portion of the metallic coating layer 13 and projects out from its upper side, with this tip end portion 22a being directly electrically connected to the metallic coating layer 13 by solder or the like. It should be understood that it would also be acceptable for the dielectric 23 to be made, for example, from a synthetic resin material such as polyethylene or the like.

While the metallic wires 9 and 15 may, for example, be made from Au bonding wire, this is not to be considered as being limitative. The metallic wire 9 electrically connects the output electrode 8a of the photoelectric conversion element 8 to the metallic coating layer 12 that is adjacent to this output electrode 8a. And the metallic wires 15 electrically connect together neighboring ones of the metallic coating layers 12.

The metallic coating layers 12 have capacitance components 12a with respect to ground (refer to FIG. 3) that depend upon the dimensions of these metallic coating layers 12 and their thicknesses, and upon the material of the substrate 20. The metallic coating layer 13 also has a capacitance component with respect to ground. With this metallic coating layer 13, the greater its diameter is made, the more it is possible to reduce its inductance component.

Figure 3:
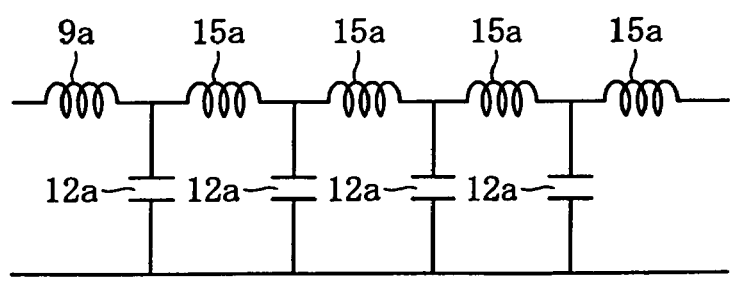
FIG. 3 is a diagram of an equivalent circuit of an impedance matching circuit.

The metallic wire 15 has an inductance component 15a that depends upon its length and its thickness, and the metallic wire 9 also has a similar inductance component (refer to FIG. 3).

As shown in FIG. 3, the equivalent circuit to this impedance matching circuit 10 is similar to a multi-stage low pass filter in which the capacitance components 12a of the plurality of metallic coating layers 12 are connected in parallel to ground, and the inductance components 9a and 15a of the plurality of metallic wires 9 and 15 are connected in series.

In order to perform impedance matching to the signal output section 21, the impedance is set to a predetermined characteristic impedance value (for example 50Ω) by adjusting the capacitance components 12a of the plurality of metallic coating layers 12, by adjusting the inductance components 9a and 15a of the metallic wires 9 and 15, and by adjusting the inductance component of the metallic coating layer 13.

The substrate 20 is made from a dielectric material whose main material is, for example, phenol resin (Bakelite), glass fiber, epoxy resin or the like, and is a standard type of substrate upon which circuit patterns of various types can be printed. This substrate 20 is fixed in the package 3. It should be understood that the package 3 is made from a metallic material.

Next, the characteristics of this photoelectric conversion module 1 will be explained. The return loss characteristic of this photoelectric conversion module 1 incorporating this impedance matching circuit 10 is shown in FIG. 4, its transmission loss characteristic is shown in FIG. 5, and its group delay characteristic is shown in FIG. 6.

In the impedance matching circuit 10 for which these measurements were performed, the number of metallic coating layers was 4, the size of these metallic coating layers was 1.2 mm length left to right and 0.15 mm width, the width of the gaps 11 was 0.05 mm, the thickness of the substrate 20 was 0.25 mm, and the relative dielectric constant of the material of which the substrate 20 was made was 9.8.

Figure 4:
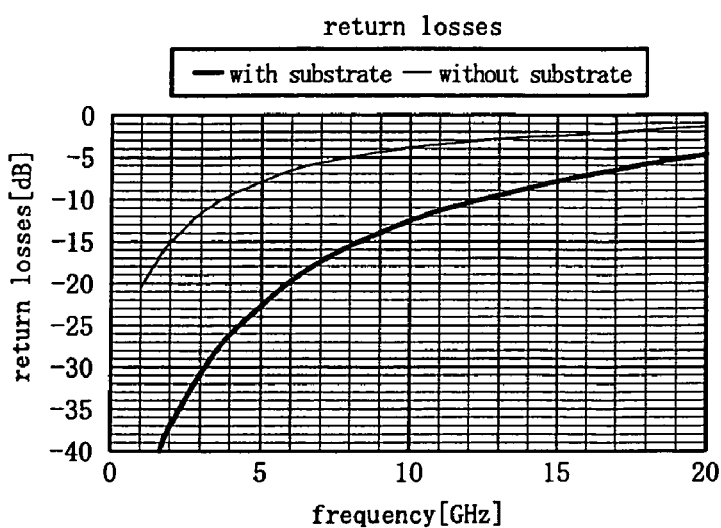
FIG. 4 is a diagram showing the return loss characteristic of the photoelectric conversion module.

By providing this impedance matching circuit 10 to the photoelectric conversion module 1, in reference to the return loss characteristic, since impedance matching can be reliably performed to the signal output section 21 as compared with a case in which no impedance matching circuit is provided, accordingly it is possible to improve the return loss characteristic by, for example, 15 dB at the signal frequency of 5 GHz, by 9 dB at 10 GHz, and by 5 dB at 15 GHz (refer to FIG. 4).

Figure 5:
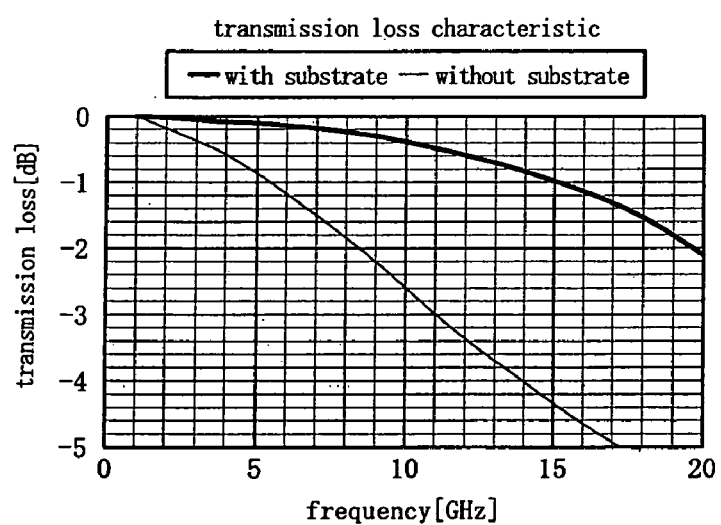
FIG. 5 is a diagram showing the transmission loss characteristic of the photoelectric conversion module.
Figure 6:
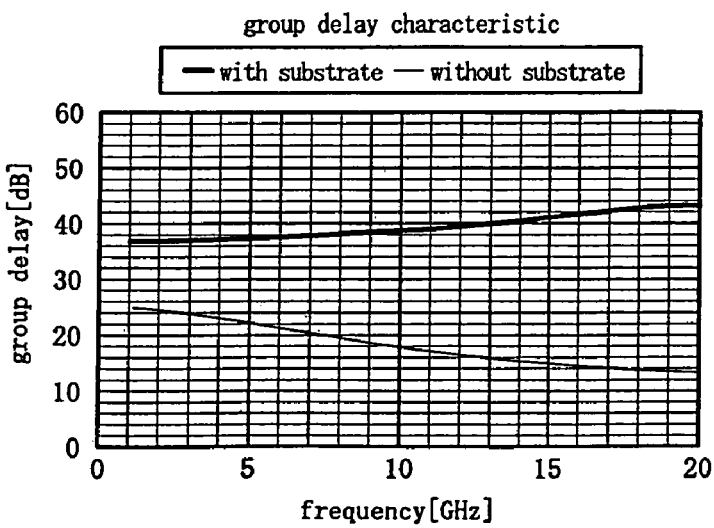
FIG. 6 is a diagram showing the group delay characteristic of the photoelectric conversion module.

And, with regard to the transmission loss characteristic, since the impedance matching circuit 10 is a similar circuit to a multi-stage low pass filter, accordingly, because it is possible to flatten the transmission characteristic within the transmission band, it is possible to improve the transmission loss by, for example, 2 dB at the signal frequency of 10 GHz and by 3.4 dB at 15 GHz (refer to FIG. 5).

Moreover, with regard to the group delay characteristic, by appropriately adjusting the capacitance components of the metallic coating layers 12 and the inductance components of the metallic wires 9 and 15, it is possible to maintain the phase linearity and to stabilize the group delay characteristic. For example, in the signal frequency band from 1 GHz to 20 GHz, it is possible to improve from a group delay fluctuation width of 12 ps to a fluctuation width of 7 ps (refer to FIG. 6). Thus, by providing the impedance matching circuit 10 in this manner, it is possible remarkably to improve the return loss characteristic, the transmission loss characteristic, and the group delay characteristic.

Next, the operation and advantages of this photoelectric conversion module 1 will be explained.

On the reception side of optical communication, first this photoelectric conversion module 1 conducts an optical signal that is transmitted by and arrives from the optical fiber 5 to the photoelectric conversion element 8 via the optical lens 6 or the like with good efficiency. Next, this optical signal is converted into an electrical signal by the photoelectric conversion element 8 with good efficiency, and this electrical signal is transmitted to the signal output section 21 via the impedance matching circuit 10, and is then outputted from this signal output section 21 to the exterior of the photoelectric conversion module 1.

Here, with this impedance matching circuit 10, it is possible to perform impedance matching for the signal output section 21 to an optimum impedance value (for example 50Ω or 75Ω) in an adequate manner, using a network analyzer or a Smith chart or the like, by appropriately adjusting the capacitance components of the plurality of metallic coating layers 12, the inductance components of the plurality of metallic wires 9, 15, and the inductance component of the metallic coating layer 13, as previously described. Thus it is possible to reduce the high frequency signal transmission loss, and in this way to improve the return loss characteristic.

Since the circuit constituted by the plurality of metallic coating layers 12 and the metallic wires 9, 15 has a structure similar to that of a multi-stage low pass filter, accordingly, while it is possible to enhance the flatness of the transmission characteristic in the high frequency band in comparison to a typical low pass filter, it also becomes possible to keep the values of both the capacitance component and also the inductance component low, and also easily to maintain the linearity of the phase of the signal, and to stabilize the group delay characteristic. In this way, it is possible to keep the distortion of the waveform of the signal during transmission at the minimum level.

Embodiment 2

Next, a photoelectric conversion module 1A according to a second embodiment will be explained.

Figure 7:
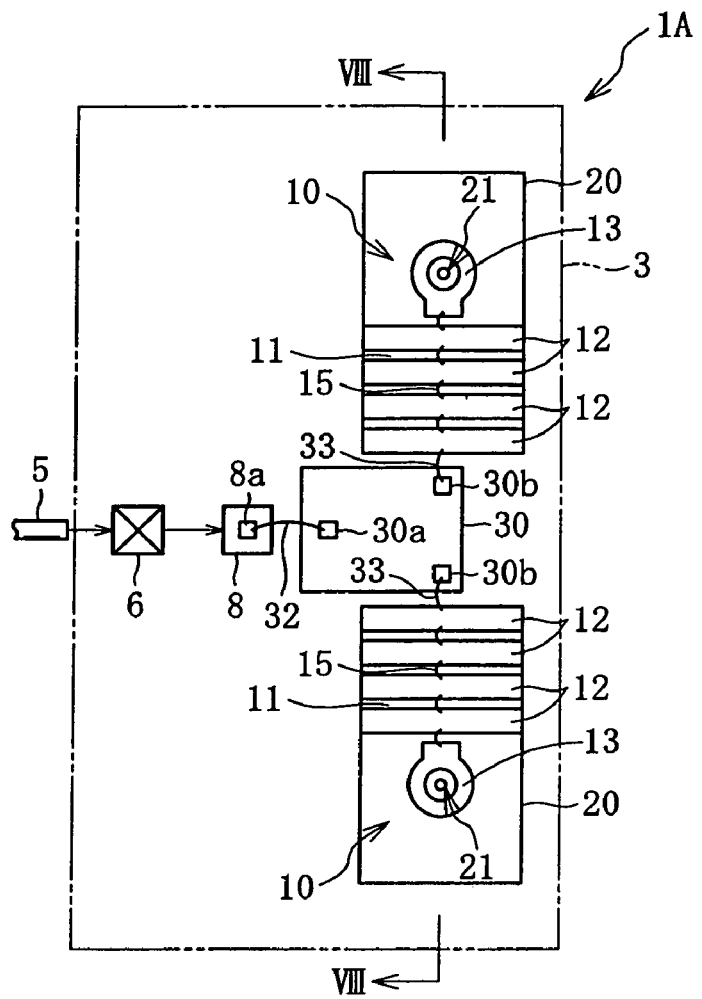
FIG. 7 is a plan view of a photoelectric conversion module according to a second embodiment.
Figure 8:
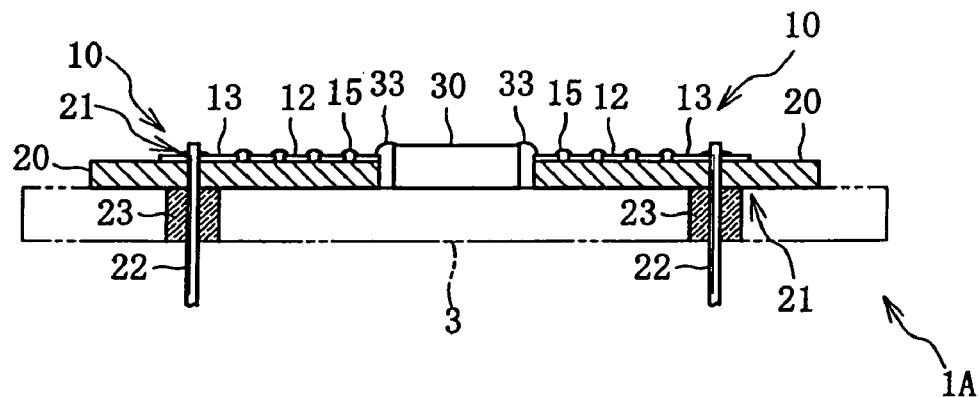
FIG. 8 is a sectional view taken along VIII-VIII line of FIG. 7.

To elements of this photoelectric conversion module 1A as shown in FIGS. 7 and 8 which are similar in structure to elements of the first embodiment, the same reference symbols are appended, and explanation thereof is omitted. With this photoelectric conversion module 1A, a single amplifier 30 and two impedance matching circuits 10 are provided between the photoelectric conversion element 8 and two signal output sections 21.

The amplifier 30 is connected to the output electrode 8a of the photoelectric conversion element 8, and amplifies the photoelectrically converted electrical signal. This amplifier 30 can amplify the single phase electrical signal that has been converted by the photoelectric conversion element 8 and convert this single phase signal into two differential signals, which it then can output from the two signal output sections 21 to the exterior of the photoelectric conversion module 1A.

The amplifier 30 is fixed to the package 3, and an input electrode 30a of the amplifier 30 is connected by a metallic wire 32 to the output electrode 8a of the photoelectric conversion element 8, while two output electrodes 30b are connected by metallic wires 33 to the input side metallic coating layers 12 of the two impedance matching circuits 10. Since the impedance matching circuits 10 include metallic wires 33 that connect between the output electrodes 30b of the amplifiers 30 and the metallic coating layers 12 that are adjacent to these output electrodes 30b, accordingly, by adjusting the lengths and thicknesses of these metallic wires 33 as appropriate, it is possible to adjust their inductance components.

Embodiment 3

Figure 9:
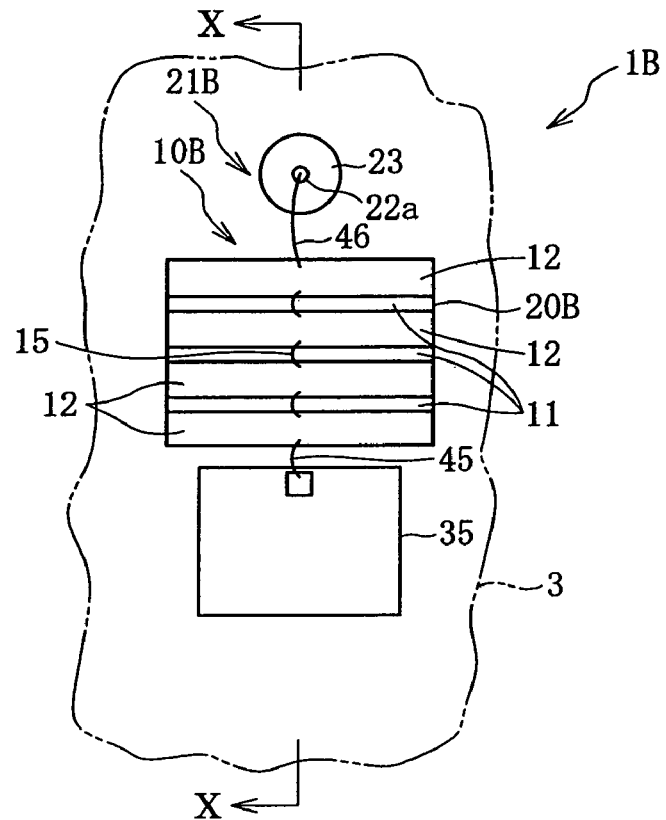
FIG. 9 is a plan view of an impedance matching circuit according to a third embodiment.
Figure 10:
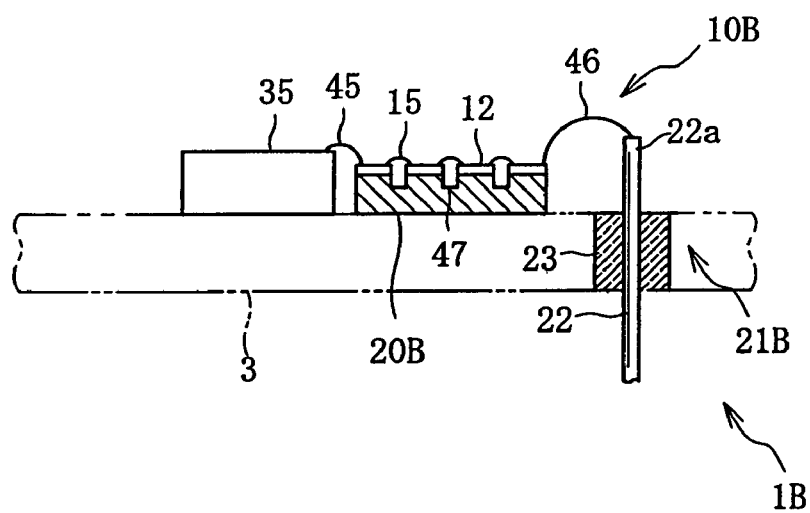
FIG. 10 is a sectional view taken along X-X line of FIG. 9.

Next, an impedance matching circuit 10B of a photoelectric conversion module 1B according to a third embodiment will be explained. To elements of this photoelectric conversion module 1B as shown in FIGS. 9 and 10 which are similar in structure to elements of the first embodiment, the same reference symbols are appended, and explanation thereof is omitted.

This impedance matching circuit 10B comprises a plurality of metallic coating layers 12 and a plurality of metallic wires 15 (these are equivalent to metallic connecting lines), and is provided between a signal input unit 35 that corresponds to the photoelectric conversion element 8 of the first embodiment or to the amplifier 30 of the second embodiment, and a signal output section 21B. This impedance matching circuit 10B is mounted upon a substrate 20B. The plurality of metallic coating layers 12 and the plurality of metallic wires 15 are the same as in the first embodiment.

The metallic coating layer 12 at the input side of this impedance matching circuit 10B is electrically connected by a metallic wire 45 to the signal input unit 35, and the metallic coating layer 12 at the output side of the impedance matching circuit 10B is electrically connected by a metallic wire 46 to the tip end portion of a lead line 22 of the signal output section 21B. These metallic wires 45 and 46 are included in the impedance matching circuit 10B. The equivalent circuit of this impedance matching circuit 10B is similar to a multi-stage low pass filter, just as in the first embodiment. The substrate 20B is fixed to the package 3, and isolating grooves 47 are formed upon the surface of the substrate 20B, at the gaps 11 between adjacent ones of the plurality of metallic coating layers 12.

Next, the characteristics of this photoelectric conversion module 1B will be explained.

Figure 11:
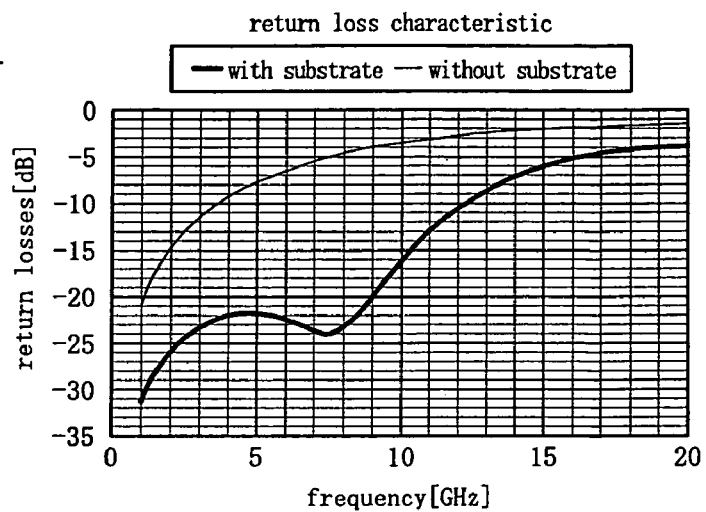
FIG. 11 is a diagram showing the return loss characteristic of the photoelectric conversion module.
Figure 12:
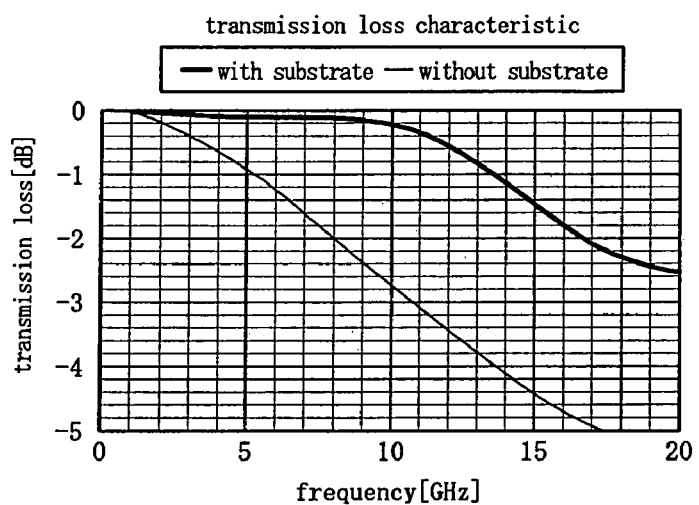
FIG. 12 is a diagram showing the transmission loss characteristic of the photoelectric conversion module.
Figure 13:
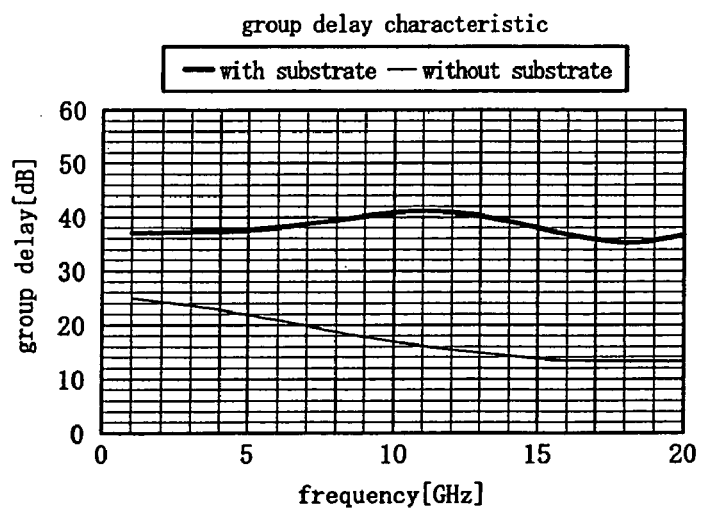
FIG. 13 is a diagram showing the group delay characteristic of the photoelectric conversion module.

The return loss characteristic of the photoelectric conversion module 1B in which this impedance matching circuit 10B is included is shown in FIG. 11, its transmission loss characteristic is shown in FIG. 12, and its group delay characteristic is shown in FIG. 13. It should be understood that, with the impedance matching circuit 10B for which these measurements were performed, the width of the isolating grooves 47 was 0.25 mm and their depth was 0.05 mm. The metallic coating layers 12 and the metallic wires 15 were the same as in the first embodiment.

By providing the impedance matching circuit 10B to this photoelectric conversion module 1B, it is possible to improve the return loss characteristic as compared with a case in which no such impedance matching circuit 10B is provided, since it is possible reliably to perform impedance matching with respect to the signal output section 12. For example, it is possible to obtain an improvement of 14 dB at the signal frequency of 5 GHz, of 13 dB at 10 GHz, and of 4 dB at 15 GHz (refer to FIG. 11).

And, with regard to the transmission loss characteristic, since the impedance matching circuit 10B is a similar circuit to a multi-stage low pass filter, accordingly, because it is possible to flatten the transmission characteristic within the transmission band, it is possible to reduce the transmission loss. For example, it is possible to obtain an improvement of 2.6 dB at the signal frequency of 10 GHz and of 3 dB at 15 GHz (refer to FIG. 12).

Moreover, with regard to the group delay characteristic, by appropriately adjusting the capacitance components of the metallic coating layers 12 and the inductance components of the metallic wires 15, 45, and 46, it is possible to maintain the phase linearity and to stabilize the group delay characteristic. For example, in the signal frequency band from 1 GHz to 20 GHz, it is possible to improve from a group delay fluctuation width of 12 ps to a fluctuation width of 6 ps (refer to FIG. 13). Thus, by providing the impedance matching circuit 10B that has the plurality of metallic coating layers 12 in this manner, it is possible to improve the return loss characteristic, the transmission loss characteristic, and the group delay characteristic.

Next, the operation and the advantages of this photoelectric conversion module 1B will be explained. Since the isolating grooves 47 are formed upon the surface of the substrate, it is possible to reinforce the isolation between adjacent ones of the metallic coating layers 41. And, since the substrate 20B is not directly connected by any electrically conductive material such as solder or the like to the signal output section 21B, accordingly the manufacture of each of the components becomes simple and easy, and it becomes possible to market the substrate 20B with the impedance matching circuit 10B mounted thereupon as an individual unit. Explanation of other advantages will be omitted, since they are the same as in the case of the first embodiment.

Now, with this impedance matching circuit 10B, it is desirable to load a dielectric (for example, alumina or the like) having lower dielectric constant than that of the material from which the substrate 20B is formed into the isolating grooves 47. In this case, it is possible to improve the isolation between adjacent ones of the metallic coating layers 12 by yet a further level.

Embodiment 4

Figure 14:
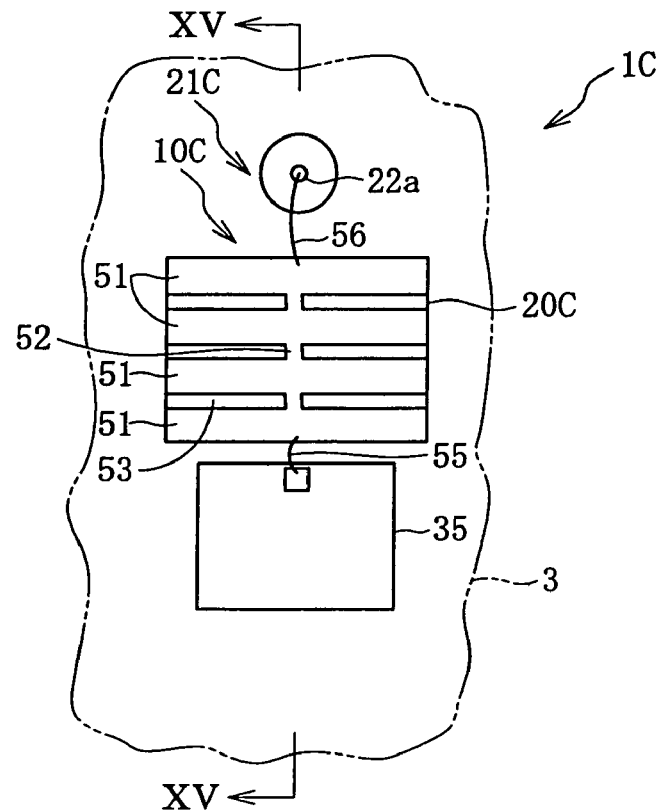
FIG. 14 is a plan view of an impedance matching circuit according to a fourth embodiment.
Figure 15:
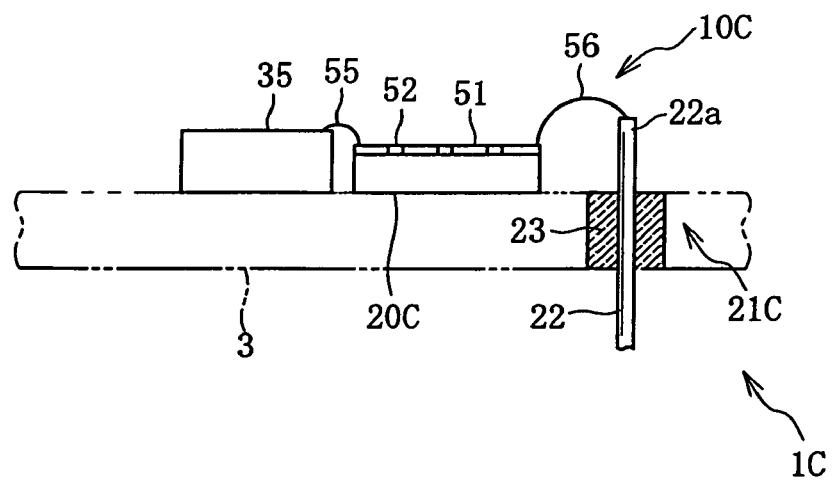
FIG. 15 is a sectional view taken along XV-XV line of FIG. 14.

Next, an impedance matching circuit 10C of a photoelectric conversion module 1C according to a fourth embodiment will be explained. As shown in FIGS. 14 and 15, this impedance matching circuit 10C comprises a plurality of metallic coating layers 51, gaps 53 that are formed between the metallic coating layers 51, a plurality of linear connecting line coating layers 52 (these are equivalent to metallic connecting lines) connecting between adjacent ones of the metallic connecting layers 51 and formed integrally with the metallic coating layers 51, and metallic wires 55, 56, etc., and these are all formed integrally upon a substrate 20C. The metallic coating layers 51 are similar to the previously described metallic coating layers 12, while the connecting line coating layers 52 have a function similar to that of the previously described metallic wires 15.

The metallic coating layer 51 on the input side of this impedance matching circuit 10C is connected by the metallic wire 55 to the signal input unit 35 that corresponds to the photoelectric conversion element of the first embodiment or to the amplifier 30 of the second embodiment, and the output side metallic coating layer 51 of the impedance matching circuit 10C is connected by the metallic wire 56 to the tip end portion 22a of a lead line 22 of a signal output section 21C. These metallic wires 55 and 56 are included in the impedance matching circuit 10C.

Next, the operation and the advantages of this photoelectric conversion module 1C will be explained.

By appropriately adjusting the widths and the layer thicknesses of the connecting line coating layers 52, it is possible to adjust the inductance components of those connecting line coating layers 52. Since the plurality of metallic coating layers 51 and the plurality of connecting line coating layers 52 are formed integrally upon the substrate 20C by the same process, it is possible to reduce the number of parts and to diminish the manufacturing cost. Furthermore the construction becomes simple, because the signal output section 21C is not directly connected to the substrate 20C.

Figure 16:
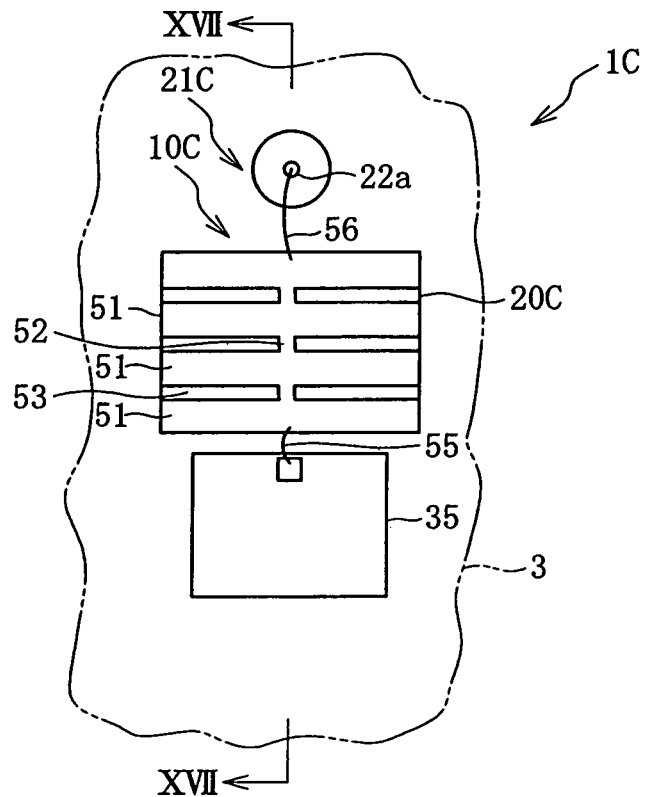
FIG. 16 is a plan view of a modified example of an impedance matching circuit according to the fourth embodiment.
Figure 17:
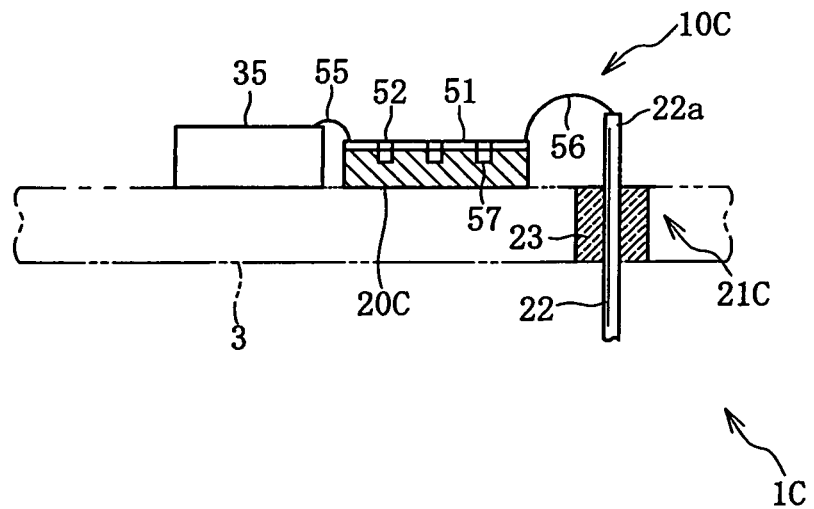
FIG. 17 is a sectional view taken along XVII-XVII line of FIG. 16.

Next, a modified example in which this impedance matching circuit 10C is somewhat modified will be explained. As shown in FIGS. 16 and 17, a plurality of isolating grooves 57 are formed in the surface of the substrate 20C, in the gaps 53 between adjacent ones of the plurality of metallic coating layers 51. It is possible to improve the isolation between adjacent ones of the metallic coating layers 51 with these isolating grooves 57. Furthermore, it is desirable to load a dielectric (for example, alumina or the like) having lower dielectric constant than that of the material from which the substrate 20C is formed into these isolating grooves 57. In this case, it is possible to improve the isolation between adjacent ones of the metallic coating layers 51 by yet a further level.

Embodiment 5

Figure 18:
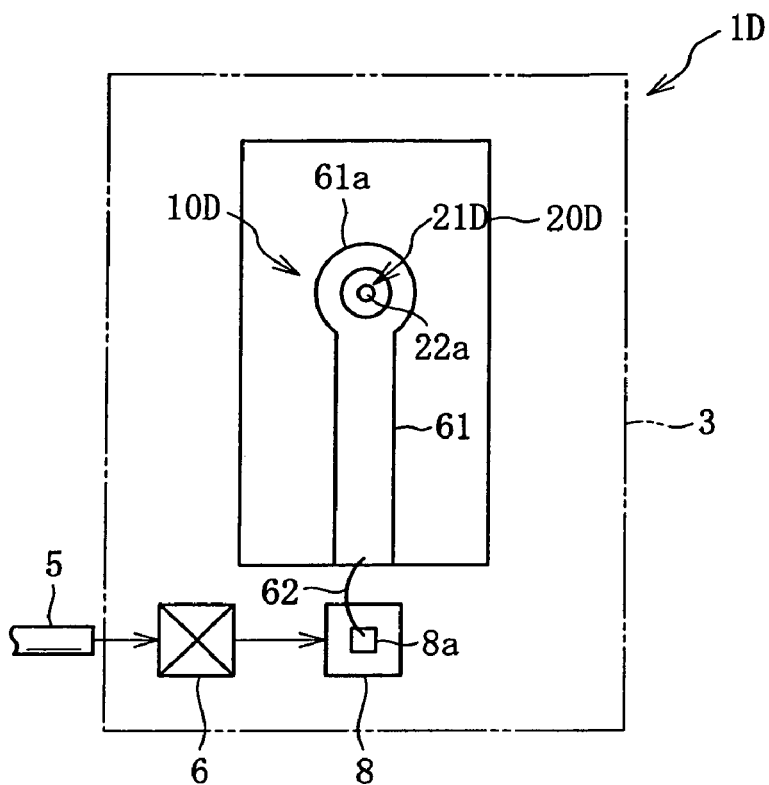
FIG. 18 is a plan view of a photoelectric conversion module according to a fifth embodiment.
Figure 19:
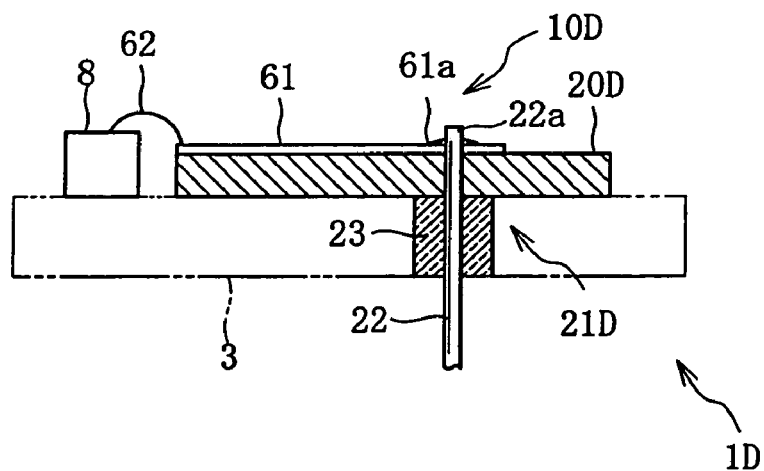
FIG. 19 is a sectional view taken along XIX-XIX line of FIG. 18.

Next, an impedance matching circuit 10D of a photoelectric conversion module 1D according to a fifth embodiment will be explained. To elements which are similar in structure to elements of the first embodiment, the same reference symbols are appended, and explanation thereof is omitted. As shown in FIGS. 18 and 19, this impedance matching circuit 10D includes a metallic coating layer 61 in micro strip form, and a metallic wire 62. This metallic coating layer 61 is formed upon the surface of a substrate 20D, and moreover is directly connected to a signal output section 21D. The metallic wire 62 electrically connects together an output electrode 8a of a photoelectric conversion element 8 and the metallic coating layer 61.

A roughly circular connection portion 61a is formed at the output side of this micro strip form metallic coating layer 61, and is directly connected by solder or the like to the tip end portion 22a of a lead line of the signal output section 21D that passes through the substrate 20D. The larger the diameter of this connection portion 61a is, the more it is possible to decrease the inductance component of the connection portion 61A. It is desirable for the width of the substrate 20D to be at least three times the width of the metallic coating layer 61.

Figure 20:
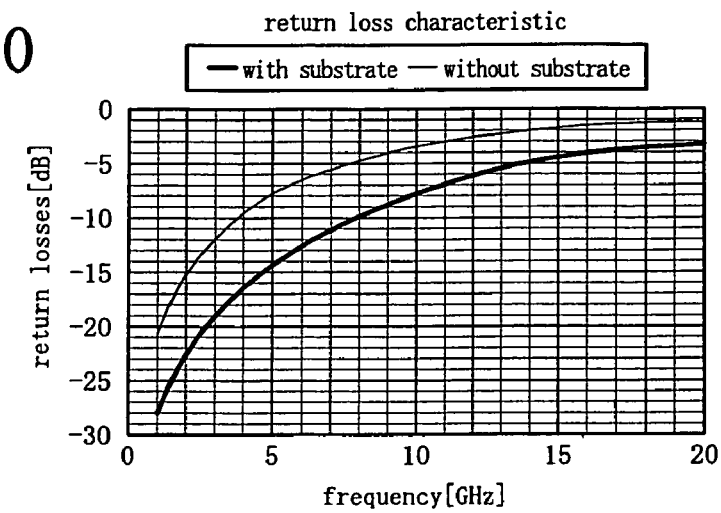
FIG. 20 is a diagram showing the return loss characteristic of the photoelectric conversion module.
Figure 21:
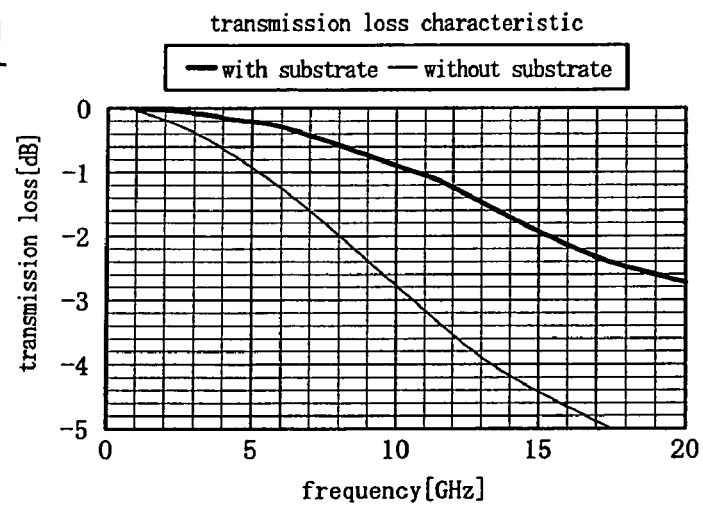
FIG. 21 is a diagram showing the transmission loss characteristic of the photoelectric conversion module.
Figure 22:
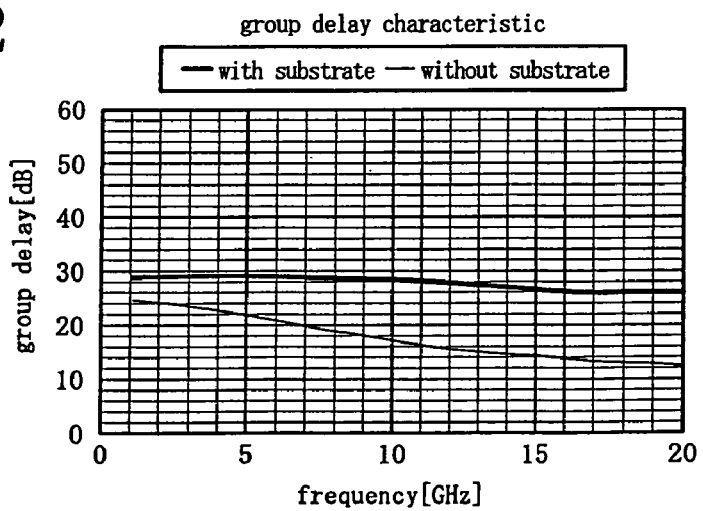
FIG. 22 is a diagram showing the group delay characteristic of the photoelectric conversion module.

Next, the characteristics of this photoelectric conversion module 1D will be explained. The return loss characteristic of this photoelectric conversion module 1D incorporating this impedance matching circuit 10D is shown in FIG. 20, its transmission loss characteristic is shown in FIG. 21, and its group delay characteristic is shown in FIG. 22. It should be understood that, with the impedance matching circuit 10D for which these measurements were performed, the width of the metallic coating layer 61 was 0.24 mm, its characteristic impedance was around 50Ω, and the diameter of the connection portion 61a was 0.4 mm. The thickness of the substrate 20D was 0.25 mm, and the relative dielectric constant of the material of which the substrate 20D was made was 9.8.

By providing this impedance matching circuit 10D to the photoelectric conversion module 1D, in reference to the return loss characteristic, impedance matching can be reliably performed to the signal output section 21D as compared with a case in which no impedance matching circuit 10D is provided. For example, it is possible to improve the return loss by 6 dB at the signal frequency of 5 GHz, by 4 dB at 10 GHz, and by 3 dB at 15 GHz (refer to FIG. 20).

And, with regard to the transmission loss characteristic, since the capacitance component and the inductance component of the micro strip form metallic coating layer 61 are stabilized, accordingly it is possible to flatten the transmission characteristic within the transmission band. Thus, it is possible to improve the transmission loss by, for example, 1.8 dB at the signal frequency of 10 GHz and by 2.5 dB at 15 GHz (refer to FIG. 21).

Moreover, with regard to the group delay characteristic, the micro strip form metallic coating layer 61 can maintain the phase linearity and can easily stabilize the group delay characteristic. For example, in the signal frequency band from 1 GHz to 20 GHz, it is possible to improve from a group delay fluctuation width of 12 ps to a fluctuation width of 3 ps (refer to FIG. 22). Thus, by providing the impedance matching circuit 10D in this manner, it is possible substantially to improve the return loss characteristic, the transmission loss characteristic, and the group delay characteristic.

Next, the operation and the advantages of this photoelectric conversion module 1D will be explained. Since the micro strip form metallic coating layer 61 is provided, accordingly it is possible approximately to calculate the characteristic impedance from the conductor width and thickness and so on. And, since the metallic coating layer 61 is directly connected to the signal output section 21, accordingly it is possible sufficiently to reduce the inductance component of the connection portion 61A. Due to this, by appropriately adjusting the dimensions of the metallic coating layer 61, it is possible reliably to perform impedance matching to the signal output section 21D and to reduce the high frequency signal transmission loss, and in this way to improve the return loss characteristic.

Since it is possible to stabilize the capacitance component and the inductance component of the micro strip form metallic coating layer 61, accordingly it is possible to enhance the flatness of the transmission characteristic in the high frequency band, and to make it easy to maintain the phase linearity and to stabilize the group delay characteristic. Due to this, it is possible to reduce distortion of the waveform of the signal during transmission to the minimum possible level.

Embodiment 6

Figure 23:
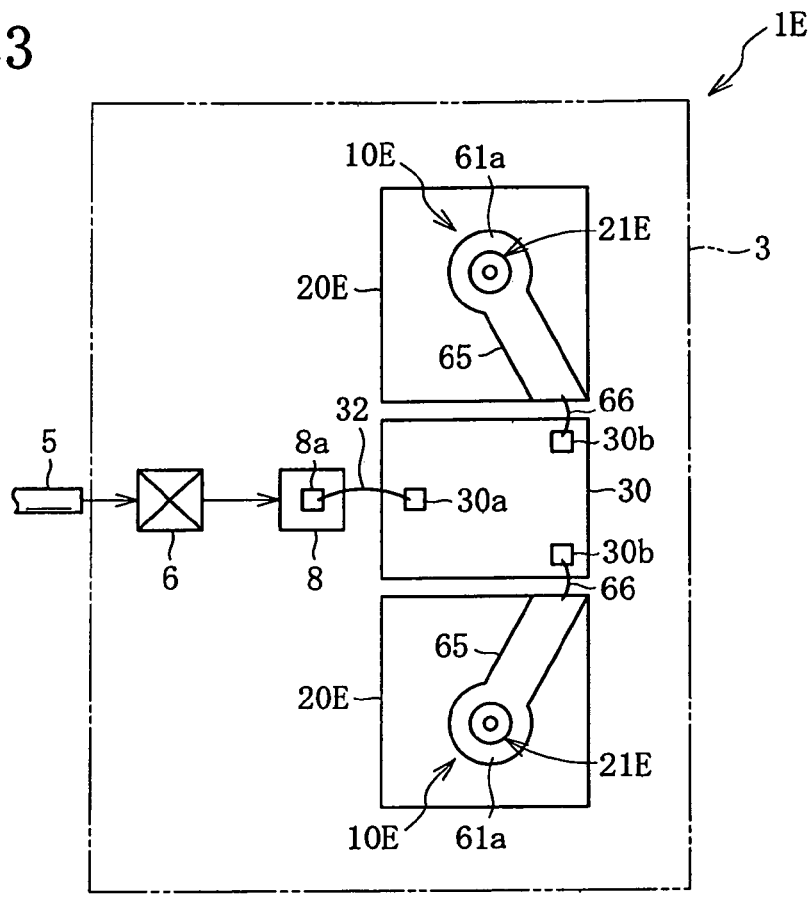
FIG. 23 is a plan view of a photoelectric conversion module according to a sixth embodiment.
Figure 24:
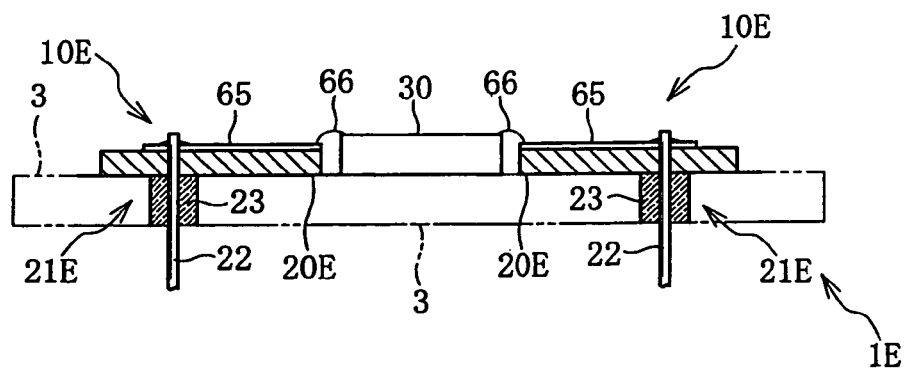
FIG. 24 is a sectional view taken along XXIV-XXIV line of FIG. 23.
Figure 25:
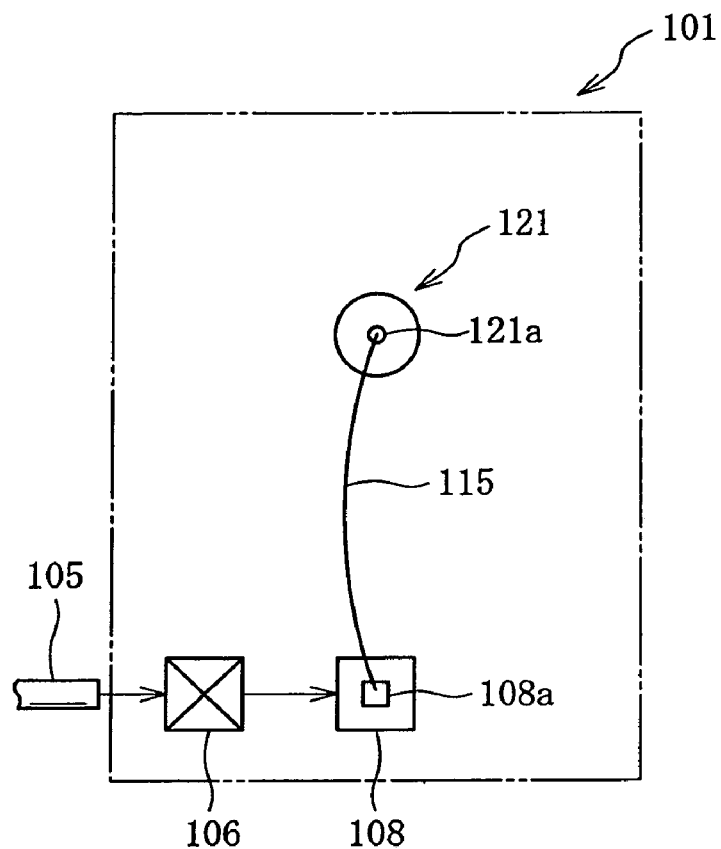
FIG. 25 is a plan view of a prior art photoelectric conversion module.
Figure 26:
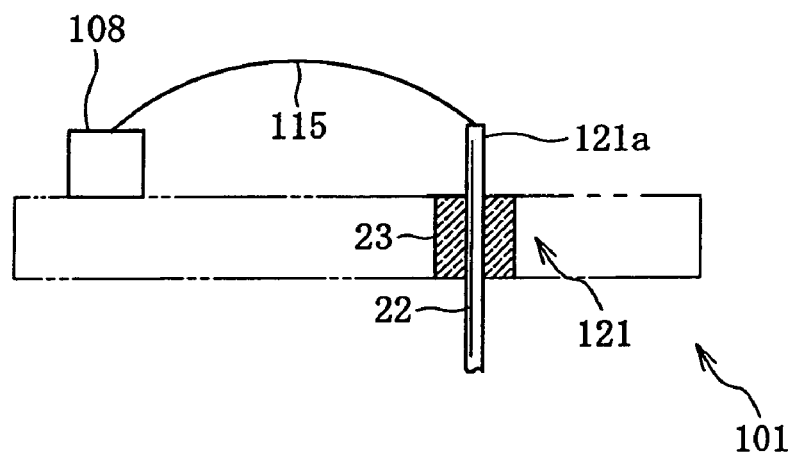
FIG. 26 is a sectional view taken along XXVI-XXVI line of FIG. 25.
Figure 27:
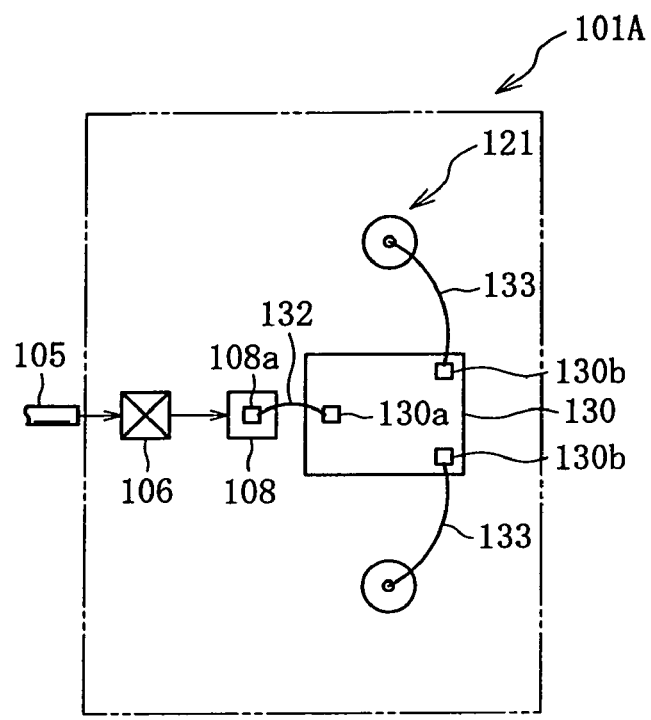
FIG. 27 is a plan view of another prior art photoelectric conversion module.
Figure 28:
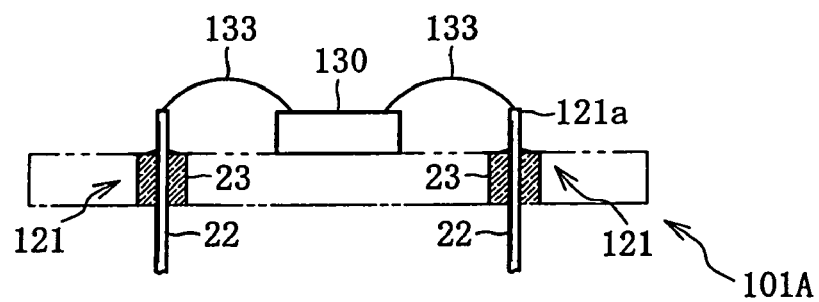
FIG. 28 is a sectional view taken along XXIIX-XXIIX line of FIG. 27.
Figure 29:
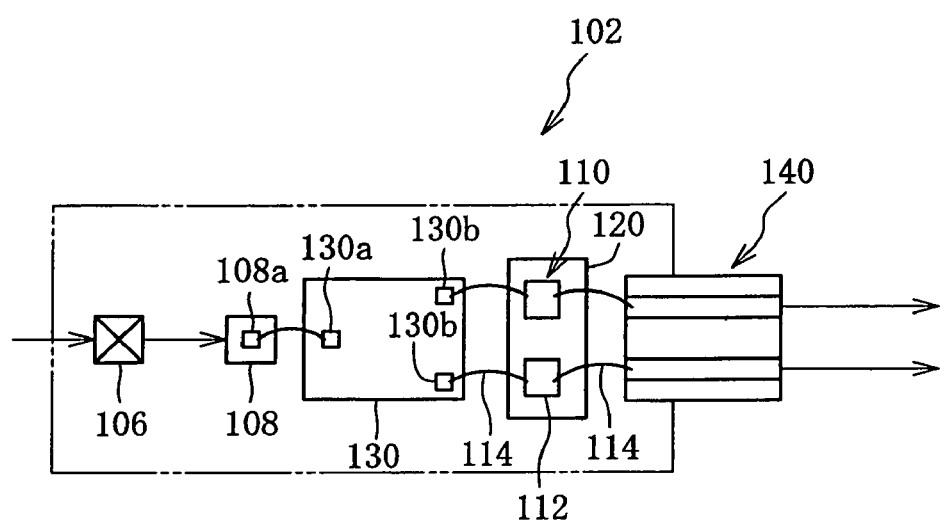
FIG. 29 is a plan view of the optical module described in Patent Document #1.
Figure 30:
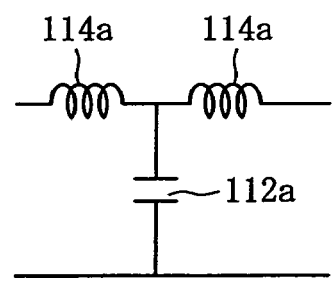
FIG. 30 is a diagram of an equivalent circuit of the impedance matching circuit of FIG. 29.

Next, a photoelectric conversion module 1E according to a sixth embodiment will be explained. In this photoelectric conversion module 1E as shown in FIGS. 23 and 24, since the optical lens 6, the photoelectric conversion element 8, and the amplifier 30 that amplifies the photoelectrically converted electrical signal are the same as in the second embodiment, the same reference symbols are appended thereto, and explanation thereof is omitted.

Each of the two output electrodes 30b of this amplifier 30 is connected by a metallic wire 66 to a metallic coating layer 65 of one of two impedance matching circuits 10E. Each of the impedance matching circuits 10E comprises the metallic coating layer 65 which is in micro strip form, and the metallic wire 66 or the like that connects the output electrode 30b of the amplifier 30 to the metallic coating layer 65.

A roughly circular connection portion 61a is formed at the end portion of the metallic coating layer 65, and is directly connected by solder or the like to the tip end portion 22a of a lead line of a signal output section 21E that passes through a substrate 20E. It is possible to adjust the capacitance component of the metallic coating layer 65 by appropriately adjusting the conductor width and length of the metallic coating layer 65, and moreover it is possible to adjust the inductance component of the metallic wire 66 by adjusting the length and the thickness of the metallic wire 66, so that it is possible to perform impedance matching to the signal output section 21 in a reliable manner. Generally similar operation and advantages are obtained as in the case of the photoelectric conversion module 1E of the fifth embodiment.

Next, a modified example in which a portion of this embodiment is modified will be explained.

(1) The numbers and the shapes of the plurality of metallic coating layers and the plurality of metallic connecting lines of the impedance matching circuit are not necessarily fixed; according to the specifications required, their numbers and shapes may be varied as appropriate.

(2) For a person skilled in the art, it is possible to implement various changes in or additions to the form of any of the embodiments above, provided that the gist of the present invention is not departed from, the present invention is to be understood as including all such modified embodiments.

This photoelectric conversion module can be applied to reception side photoelectric conversion modules for optical communication of various types; and, since the impedance matching circuit is provided in which the metallic coating layer of multi-stage low pass filter form or micro strip form is mounted, accordingly, along with it being possible to reduce return losses due to impedance mismatching and to enhance the flatness of the transmission characteristic in the high frequency band, it is also possible to stabilize the group delay characteristic by maintaining the phase linearity.

What is claimed is:

1. A photoelectric conversion module comprising a photoelectric conversion element for converting an optical signal transmitted via an optical fiber into an electrical signal, and a signal output section for outputting to the exterior the electrical signal after photoelectric conversion, comprising:

an impedance matching circuit that is provided between said photoelectric conversion element, or an amplifier that is connected to said photoelectric conversion element, and said signal output section, and a substrate upon which said impedance matching circuit is mounted;

said impedance matching circuit comprises a plurality of metallic coating layers formed upon a surface of said substrate with gaps left between adjacent ones of these metallic coating layers, a plurality of metallic connecting lines that electrically connect adjacent ones of these metallic coating layers, and a metallic wire that connects said metallic layer that is most towards the input side to said photoelectric conversion element or to said amplifier that is connected to said photoelectric conversion element;

wherein an isolating groove is formed upon a surface of said substrate at each gap between adjacent ones of said plurality of metallic coating layers.

2. A photoelectric conversion module according to claim 1, wherein a dielectric that has a lower dielectric constant than a base material of which said substrate is formed is charged into said isolating groove.

3. A photoelectric conversion module according to claim 1, wherein said metallic connecting lines are metallic wires.

4. A photoelectric conversion module according to claim 1, wherein said metallic connecting lines are linear metallic coating layers that are integral with said metallic coating layers.

* * * * *